United States Patent [19]

Fuse et al.

[11] Patent Number: 4,642,693
[45] Date of Patent: Feb. 10, 1987

[54] TELEVISION VIDEO SIGNAL A/D CONVERTER APPARATUS

[75] Inventors: Takahiro Fuse; Masao Kawamura; Koji Yamagishi, all of Tokyo; Kazuyuki Odachi, Tokorozawa; Haruo Ono; Masaharu Kizaki, both of Tokyo, all of Japan

[73] Assignee: Casio Computer Co., Ltd., Tokyo, Japan

[21] Appl. No.: 733,584

[22] Filed: May 13, 1985

[30] Foreign Application Priority Data

May 22, 1984 [JP] Japan .................................. 59-103035

[51] Int. Cl.[4] ............................................. H04N 5/74
[52] U.S. Cl. .................................. 358/236; 358/169; 358/160; 307/358
[58] Field of Search ........................ 358/236, 160, 230; 350/332; 340/784; 307/358; 358/169, 21 R, 23

[56] References Cited

U.S. PATENT DOCUMENTS

| | | | |
|---|---|---|---|
| 4,064,484 | 12/1977 | Mese et al. ...................... | 358/169 X |
| 4,101,839 | 7/1978 | Poole et al. ..................... | 307/358 X |
| 4,395,732 | 7/1983 | Upton .................................... | 358/169 |
| 4,403,253 | 9/1983 | Morris et al. ........................ | 358/160 |
| 4,523,232 | 6/1985 | Kameda et al. ..................... | 358/236 |
| 4,558,348 | 12/1985 | Bolger et al. ................. | 358/21 R X |

Primary Examiner—James J. Groody
Assistant Examiner—E. Anne Toth
Attorney, Agent, or Firm—Frishauf, Holtz, Goodman & Woodward

[57] ABSTRACT

A television video signal A/D converter apparatus in a liquid crystal television receiver has an A/D converter for A/D converting a television video signal. Upper and lower reference potentials for determining an operating voltage amplitude are supplied to the A/D converter from a reference potential generator. The upper and lower reference potentials are divided at a given ratio by a resistor so as to fix an average potential of the television video signal at a constant value using the potential at the dividing point as a bias potential, and thereafter the television video signal is supplied to the A/D converter.

8 Claims, 6 Drawing Figures

TELEVISION VIDEO SIGNAL A/D CONVERTER APPARATUS

BACKGROUND OF THE INVENTION

The present invention relates to an improvement in a television video signal A/D converter apparatus for a liquid crystal television receiver.

Recently, portable television receivers using a liquid crystal display panel as a display unit have been developed. In a television receiver using a conventional liquid crystal display panel, a video signal amplified by a video amplifier is converted into a digital signal by an A/D converter, and the digital signal drives the liquid crystal panel. However, the conventional liquid crystal display panel has a narrow gradation range from the white level to black level, and cannot provide an image having good contrast. In order to overcome such a drawback, the average value of the television video signal is operated, and upper and lower reference potentials of the A/D converter are set in accordance with the operated average value, thus obtaining good contrast. Since the video signals do not always change from the white level to black level and the overall range of the video signals need not be converted into digital signals, the conversion range of the A/D converter changes in accordance with the video signals, thus improving contrast. In this manner, when the reference potentials of the A/D converter are set, the video signals are supplied to a low-pass filter so as to detect the average potential a. Thus, the upper reference potential is given as $a+\alpha$ by adding the average potential a to an appropriate potential $\alpha$, and the lower reference potential is given as $a-\beta$ by subtracting an appropriate potential $\beta$ from the average potential a.

In this manner, conventionally, since the upper and lower reference potentials are obtained by operation, an active element such as an operation amplifier is required, resulting in a complex circuit configuration and high cost. Particularly, in a color television receiver, three circuits for R, G and B are needed, thus considerably increasing the number of elements. In the conventional method, if the video signals do not include DC components, the average potential cannot be detected. For this reason, when the video signals are sent from external equipment, a television signal input terminal and the like must be provided so as to perform DC reproduction processing.

SUMMARY OF THE INVENTION

It is an object to provide a television video signal A/D converter apparatus in a liquid crystal television which is free from the above drawbacks, and which can set upper and lower reference potentials using only passive elements and thereby simplify the circuit configuration.

In order to achieve the above object, there is provided a liquid crystal television video signal A/D converter apparatus according to the present invention comprising: A/D converting means for A/D converting a television video signal; reference potential generating means connected to the A/D converting means and comprising means for supplying a predetermined upper reference potential and means for supplying a predetermined lower reference potential; and high-pass filter means for dividing the upper and lower reference potentials at a given ratio by a resistor so as to supply to the A/D converting means an input television video signal having a potential level which is fixed at a constant value using the potential at the dividing point of the upper and lower reference potentials as a bias potential.

With this arrangement, according to the video signal A/D converter apparatus in the liquid crystal television of the present invention, since the average potential of the television video signal is fixed at a constant value by using a high-pass filter, the television video signal near the average potential can be A/D converted. Since the upper and lower reference potentials can be set by resistors, an active element is not required, thus achieving a simple circuit configuration and low cost. Furthermore, since DC components of the television video signals are not needed, when the video signals are received from external equipment, a television video signal input terminal for DC reproduction can be omitted, thus further simplifying the circuit configuration.

When the present invention is applied to a color liquid crystal television receiver, the same effect as described above can be obtained.

DETAILED DESCRIPTION OF THE PREFERRED EMBODIMENTS

An embodiment of the present invention will be described with reference to the accompanying drawings.

Figure 1:
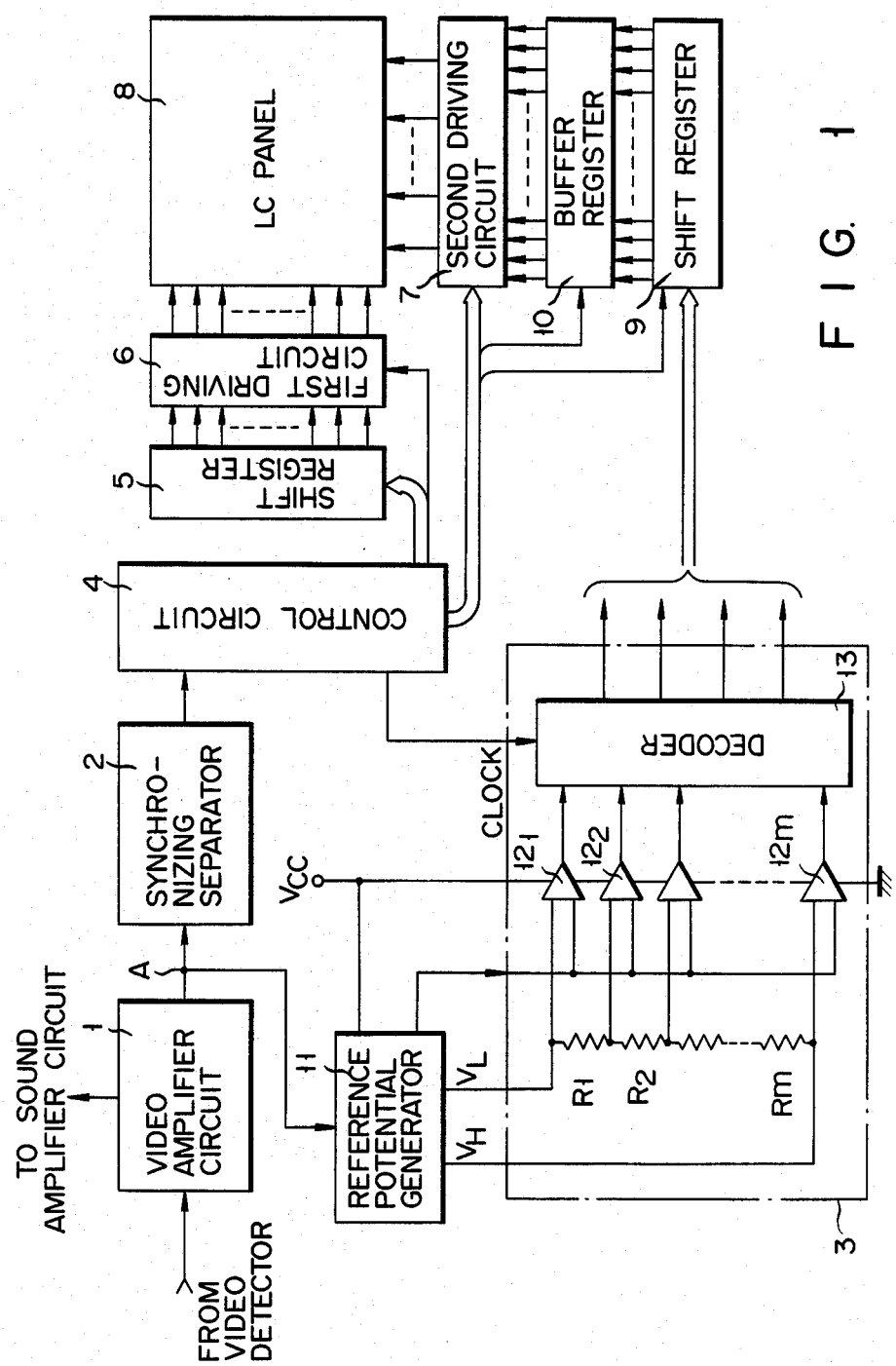
FIG. 1 is a block circuit diagram showing a state wherein a television video signal A/D converter apparatus in a liquid crystal television receiver according to an embodiment of the present invention is built in an image display apparatus.

In order to simplify description of the present invention, a circuit configuration in which a television video signal A/D converter apparatus according to the present invention is built in a liquid crystal panel as a liquid crystal display device will first be described with reference to FIG. 1. A television video signal from a video detector circuit (not shown) is amplified by a video amplifier circuit 1, and is supplied to a synchronizing separator 2 and an A/D converter 3 through a reference potential generator 11. The separator 2 separates horizontal and vertical synchronizing signals from the television video signal, and these signals are supplied to a control circuit 4. The circuit 4 supplies a drive signal to a first driving circuit 6 through a shift register 5.

The circuit 6 supplies a signal to a liquid crystal (LC) panel 8 causing it to scan common electrodes. The A/D converter 3 converts the television video signal from the circuit 1 into a parallel 4-bit digital signal, and supplies the digital signal to a shift register 9. The data supplied to the register 9 is sequentially supplied to a second driving circuit 7 through a buffer register 10 in response to a timing signal from the control circuit 4.

The second driving circuit 7 comprises a decoder and gates, produces, e.g., a 16-gradation signal in response to a pulse signal from the circuit 4, and supplies the signal to the LC panel 8 so as to drive a signal electrode.

The video signal from the circuit 1 is supplied to the A/D converter 3 through a reference potential generator 11. Upper and lower reference potentials VH and VL generated from the generator 11 are supplied to the A/D converter 3 and are divided by resistors R1, R2, . . . ,Rm, and divided potentials are supplied to comparators $12_1$, $12_2$, . . . ,$12_m$ as reference potentials. These comparators $12_1$, $12_2$, . . . ,$12_m$ compare the television video signal from the circuit 1 and the divided reference potential signals only while a bias voltage Vcc is applied thereto, and supply their comparison outputs to a decoder 13. The decoder 13 converts the video signals into digital signals and supplies them to the register 9 as 4-bit code signals. The data supplied to the register 9 is displayed on the LC panel 8 through the register 10 and the circuit 7 as described above.

Figure 2:
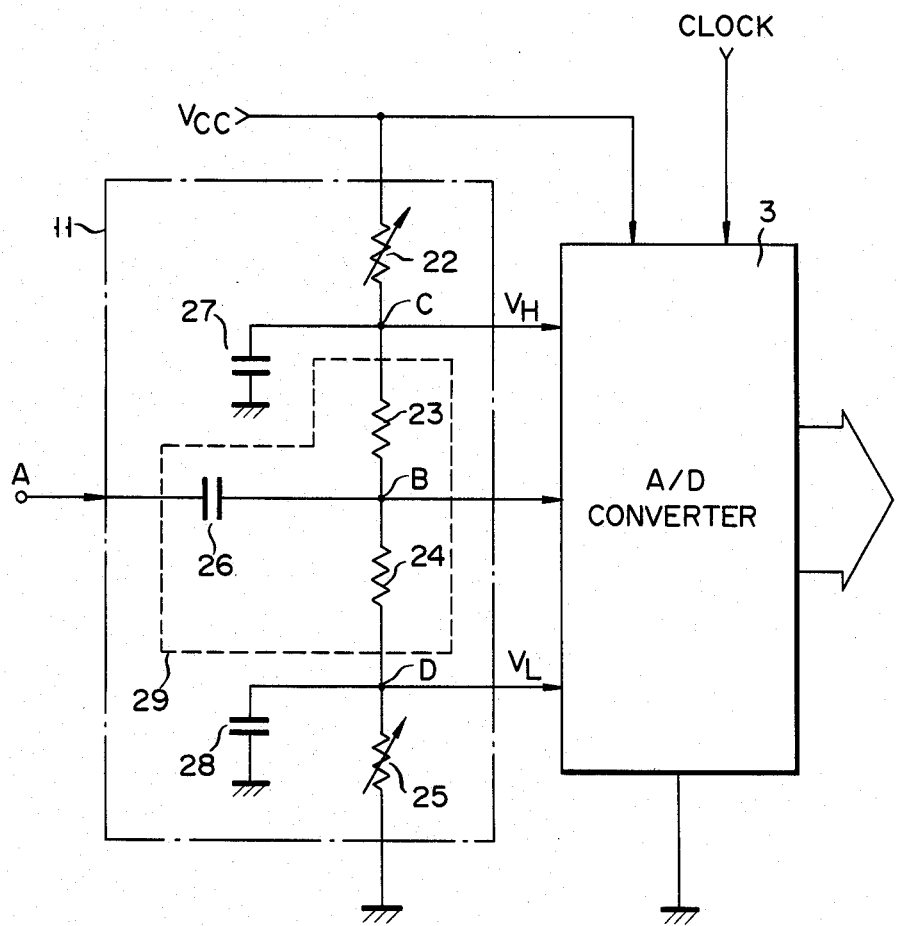
FIG. 2 is a detailed circuit diagram showing the reference potential generator in FIG. 1 and a connecting state to the A/D converter.

The reference potential generator 11 shown in FIG. 1 will be described in more detail with reference to FIG. 2. A Vcc power source voltage is supplied to the A/D converter 3. A variable resistor 22, resistors 23 and 24, and a variable resistor 25 are connected in series between the Vcc power source and a ground terminal. The television video signal supplied to an input terminal A from the video amplifier circuit (not shown) is supplied to the A/D converter 3 through a node B between a capacitor 26 and the resistors 23 and 24. In this case, the capacitor 26, and the resistors 23 and 24 constitute a high-pass filter 29. A node C between the resistors 22 and 23 is grounded through a capacitor 27. A node D between the resistors 24 and 25 is grounded through a capacitor 28. Potentials appearing at the nodes C and D are respectively supplied to the A/D converter 3 as the upper and lower reference potentials VH and VL, respectively. Since the A/D converter 3 receives a sampling clock from the control circuit 4, digital data converted in synchronism with the clock is generated therefrom.

Figure 3:
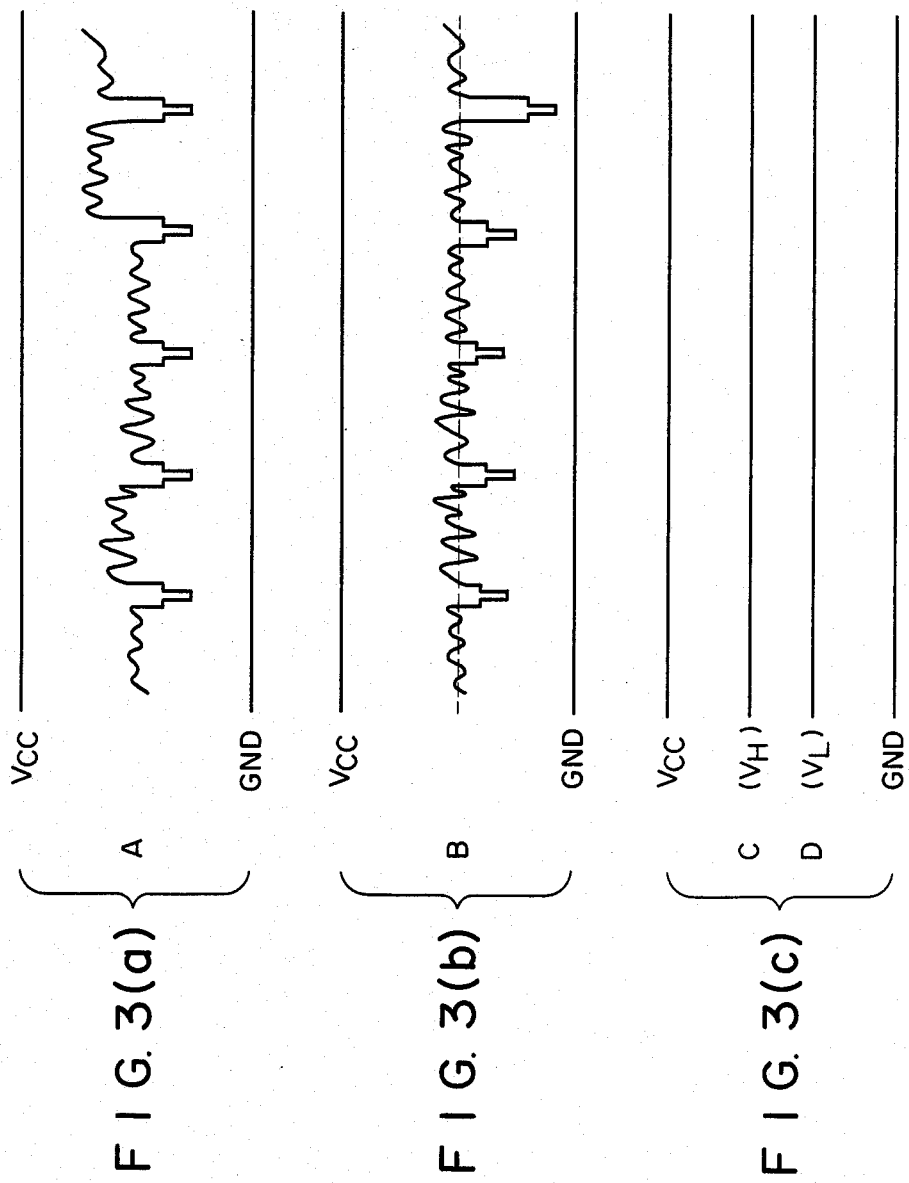
FIGS. 3(a) to 3(c) are timing charts for explaining the operation of the circuit shown in FIGS. 1 and 2.

Operation of this embodiment will be described hereinafter. A video signal supplied to the input terminal A from the video amplifier circuit 1 as shown in FIG. 3(a) is supplied to the high-pass filter 29 having the capacitor 26 and the resistors 23 and 24 so as to remove DC and low frequency components therefrom and is then supplied to the A/D converter 3. In the video signal from the circuit 1, levels of the synchronizing signals are substantially the same, as shown in FIG. 3(a). When the DC and low frequency components are removed therefrom by the high-pass filter 29, the level of the video signal varies about its average value. In this case, the average value is fixed to a DC voltage level at the node B, i.e., a constant potential determined by the resistors 22, 23, 24 and 25, as shown in FIG. 3(b). In this case, in order to reduce influence of the vertical and horizontal synchronizing signals, the average value is preferably set at a value which is shifted from an intermediate value between the DC potentials at the nodes C and D to the node D side by dividing the DC potential at the node B. Meanwhile, the DC voltages at the nodes C and D shown in FIG. 3(c) are determined by the resistors 22, 23, 24 and 25 and are supplied to the A/D converter 3 as the upper and lower reference potentials VH and VL. In this manner, since the upper and lower reference potentials VH and VL defining the A/D conversion range together with the television video signal varying about the potential at the node B are supplied to the A/D converter, the video signal near the average value can be A/D converted. When the variable resistors 22 and 25 are operated, the upper and lower reference potentials are changed, thus adjusting contrast.

Figure 4:
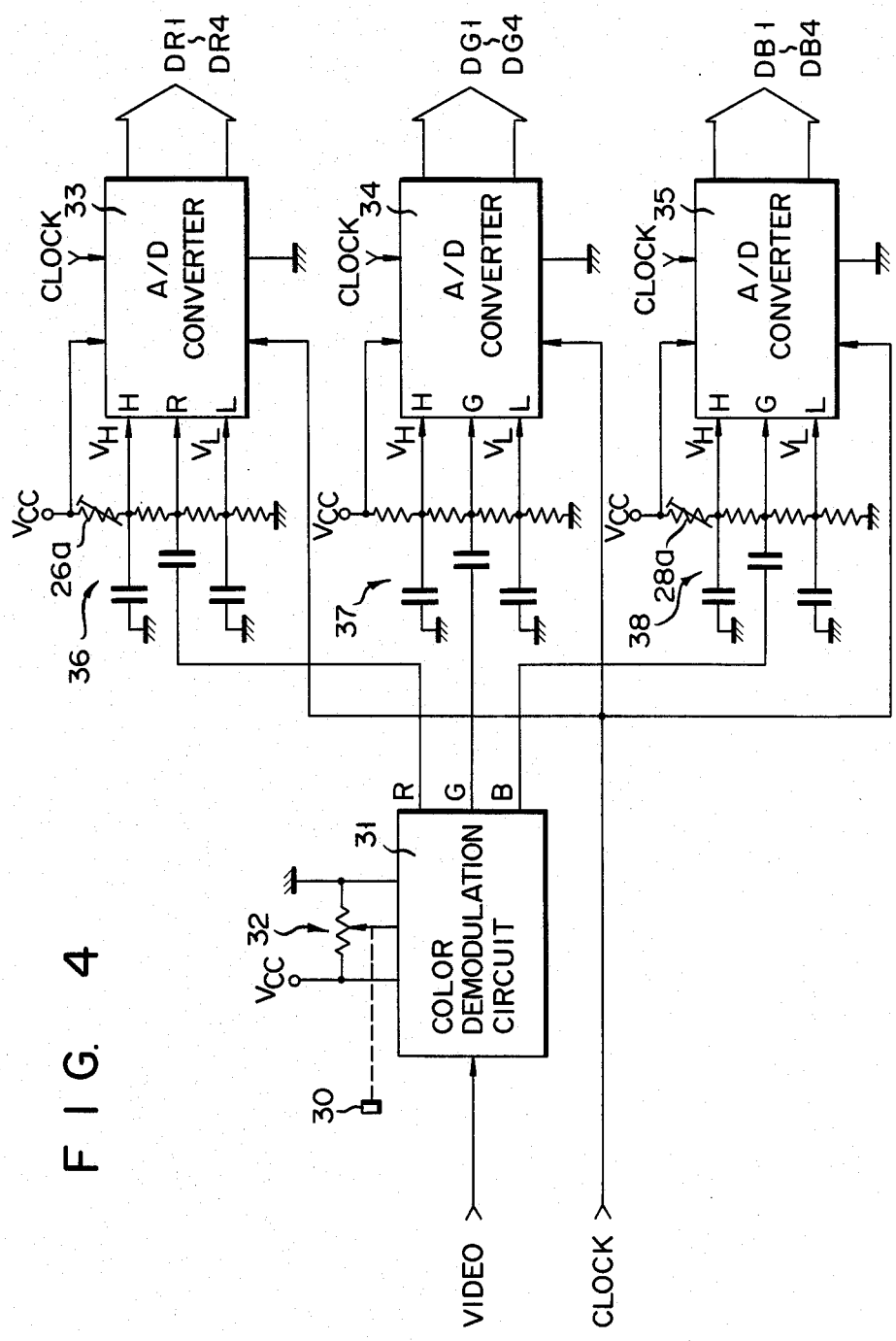
FIG. 4 is a block circuit diagram showing a modification when the present invention is applied to a color liquid crystal television receiver.

A case will be described wherein the present invention is applied to a color liquid crystal television receiver. FIG. 4 is a block circuit diagram showing the overall television video signal A/D converter apparatus applied to the color liquid crystal television receiver. The A/D converter apparatus comprises a color demodulation circuit 31, a contrast adjusting potentiometer 32, parallel comparison type A/D converters 33, 34 and 35 and reference potential generators 36, 37 and 38.

When the color television video signal is supplied to the circuit 31, it is demodulated into R, G and B color signals and the signals are generated therefrom. At this time, a knob 30 can be operated to adjust amplitudes of the color signals generated from the circuit 31. The R, G and B color signals are supplied to the generators 36, 37 and 38, respectively, so as to generate the corresponding upper and lower reference potentials VH and VL, respectively, thus supplying a bias to the color television video signal. The A/D converters 33, 34 and 35 convert the input video signals into digital signals DR1 to DR4, DG1 to DG4 and DB1 to DB4 in synchronism with the sampling clock, and supply the digital signals to a liquid crystal driver (not shown).

An adjusting method of the A/D converter will be described hereinafter. The amplitudes of the R, G and B color signals generated from the circuit 31 are changed by varying the potentiometer 32, as described above. Therefore, the amplitudes of the color signals can be adjusted to proper levels by adjusting the contrast. Then, controls of the generators 36 and 38 for R and B signals are adjusted so as to change reference levels of the R and B signals for A/D conversion without changing a reference level of the G signal therefrom so as to change levels of the digital signals DR1 to DR4 and DB1 to DB4, thus displaying proper colors on the liquid crystal panel. As described above, in the color liquid crystal television receiver, respective average values for R, G and B color signals are fixed at constant values and are A/D converted.

What is claimed is:

1. A television video signal A/D converter apparatus in a liquid crystal television receiver, comprising:
   A/D converting means for A/D converting a television video signal;
   reference potential generating means connected to said A/D converting means and comprising means for supplying a predetermined upper reference potential (VH) and means for supplying a predetermined lower reference potential (VL); and
   high-pass filter means for dividing the upper and lower reference potentials at a given ratio by a resistor so as to supply to said A/D converting means the input television video signal having a potential level which is fixed at a constant value using the potential at the dividing point of the upper and lower reference potentials as a bias potential.

2. An apparatus according to claim 1, wherein said upper and lower reference potential supplying means in said reference potential generating means respectively comprise resistors for adjusting the upper and lower reference potentials so as to determine operating voltage amplitudes.

3. An apparatus according to claim 1, wherein said upper and lower reference potential supplying means respectively comprise smoothing capacitors.

4. An apparatus according to claim 1, wherein said high-pass filter means comprises a capacitor for receiving the television video signal and resistor means, having a middle point to which said capacitor is connected, for dividing the upper and lower reference potentials.

5. An apparatus according to claim 1, wherein said A/D converting means comprises Red, Green and Blue A/D converting circuits for A/D converting a color television video signal.

6. An apparatus according to claim 5, wherein said A/D converting means have a color demodulating circuit for demodulating the television video signal into Red, Green and Blue color signals so as to supply the Red, Green and Blue color signals to said corresponding Red, Green and Blue A/D converting circuits.

7. An apparatus according to claim 6, wherein said color demodulation circuit has variable resistor means for adjusting contrast.

8. An apparatus according to claim 5, wherein at least two of said Red, Green and Blue A/D converting circuits have variable resistor means for adjusting contrast at input sides thereof.

* * * * *